United States Patent
Cabessa et al.

(10) Patent No.: US 10,534,146 B2
(45) Date of Patent: Jan. 14, 2020

(54) DEVICE AND METHOD FOR HEAT DISSIPATION

(71) Applicant: DustPhotonics Ltd., Modiin (IL)

(72) Inventors: Moti Cabessa, Netanya (IL); Amir Geron, Modiin (IL); Adaya Terem, Tel Aviv (IL); Victor Bigio, Giv'atayim (IL)

(73) Assignee: DUSTPHOTONICS LTD., Modiin (IL)

( * ) Notice: Subject to any disclaimer, the term of this patent is extended or adjusted under 35 U.S.C. 154(b) by 0 days.

(21) Appl. No.: 15/908,852

(22) Filed: Mar. 1, 2018

(65) Prior Publication Data

US 2019/0271818 A1   Sep. 5, 2019

(51) Int. Cl.
| | | |
|---|---|---|
| H05K 7/20 | (2006.01) | |
| G02B 6/42 | (2006.01) | |
| H05K 1/02 | (2006.01) | |
| H04B 10/40 | (2013.01) | |

(52) U.S. Cl.
CPC ........... *G02B 6/4269* (2013.01); *G02B 6/426* (2013.01); *G02B 6/428* (2013.01); *H04B 10/40* (2013.01); *H05K 1/0206* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 9,474,188 B2* | 10/2016 | Moore | .................. | H05K 3/301 |
| 9,668,334 B2* | 5/2017 | Refai-Ahmed | ...... | H05K 1/0203 |
| 9,743,553 B2* | 8/2017 | Kim | .................... | H05K 7/20336 |
| 9,781,863 B1* | 10/2017 | Kim | .................... | H01L 23/3677 |
| 2006/0018098 A1* | 1/2006 | Hill | ...................... | H05K 1/0204 361/708 |
| 2012/0057388 A1* | 3/2012 | Garrity | ................. | H02M 3/338 363/144 |
| 2013/0294126 A1* | 11/2013 | Garrity | ............... | H02M 7/4807 363/95 |
| 2017/0354057 A1* | 12/2017 | Dorenkamp | ......... | H05K 7/2089 |
| 2017/0358920 A1* | 12/2017 | Galin | ...................... | H02J 3/385 |
| 2018/0131322 A1* | 5/2018 | Deceglie | ................ | G01R 31/40 |

* cited by examiner

*Primary Examiner* — Courtney L Smith
(74) *Attorney, Agent, or Firm* — Reches Patents

(57) ABSTRACT

A method for passively coupling an optical fiber to an optoelectronic chip, the method may include connecting the optical fiber to an optical cable interface of a first portion of an optical coupler; wherein the optical coupler further comprises a second portion; wherein the first portion comprises first optics that comprises a first lens array, an optical cable interface and three contact elements, each contact element has a spherical surface; and wherein the second portion comprises second optics that comprise a second lens array, and three elongated grooves; connecting the optical coupler to a substrate that supports the optoelectronic chip; and mechanically coupling the first portion to the second portion by aligning the three contact elements of the first portion with the three elongated grooves of the second portion thereby an optical axis related to a first lens array of the first portion passes through a point of intersection between longitudinal axes of the three elongated grooves, and an optical axis related to the second lens array passes through the point of intersection.

20 Claims, 12 Drawing Sheets

DEVICE AND METHOD FOR HEAT DISSIPATION

BACKGROUND

A major problem in optical transceiver design is thermal dissipation of the heat generated by the active components to the system in which the device is located.

There is a growing need for an efficient device and method for heat dissipation.

SUMMARY

There may be provided an opto-mechanical device that may include (i) an optical transceiver that may include an active component; (ii) a printed circuit board that may include an upper side, a lower side and thermal conductors that thermally couples an area of the upper side to at an area of the lower side; wherein the active component is connected to the area of the upper side; (iii) a housing that may include an upper portion and a lower portion that form one or more continuous heat dissipation paths; wherein the housing surrounds the printed circuit board; (iv) a thermally conductive material that is positioned between the housing and the printed circuit board and forms at least one gapless thermally conductive path between the housing and the printed circuit board; and (v) a heat sink that is thermally coupled to the upper portion of the housing.

The housing may include at least one hole for receiving the thermally conductive material.

The opto-mechanical device may include at least one seal for sealing the at least one hole.

The housing may include sidewalls for dissipating the heat that passes through the one or more continuous heat dissipation paths.

The thermally conductive material may fully fill a part of the gap that is positioned between the area of the lower side of the printed circuit board and a corresponding area of the housing.

There may be provided a method for cooling an active component of an optical transceiver, the method may include dissipating heat generated by an active component of an optical transceiver, wherein the active component is connected to an area of an upper side of a printed circuit board, wherein the heat is dissipated through (a) one or more thermal conductors that thermally coupled the area of the upper side to an area of a lower side of the printed circuit board; (b) at least one gapless thermally conductive path that is formed by a thermally conductive material, between the area of the lower side and between a lower portion of a housing; (c) one or more continuous thermal paths that are formed between the lower portion of the housing and an upper portion of the housing; and (d) a heat sink that is thermally coupled to the upper portion of the housing; and wherein the housing surrounds the printed circuit board.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
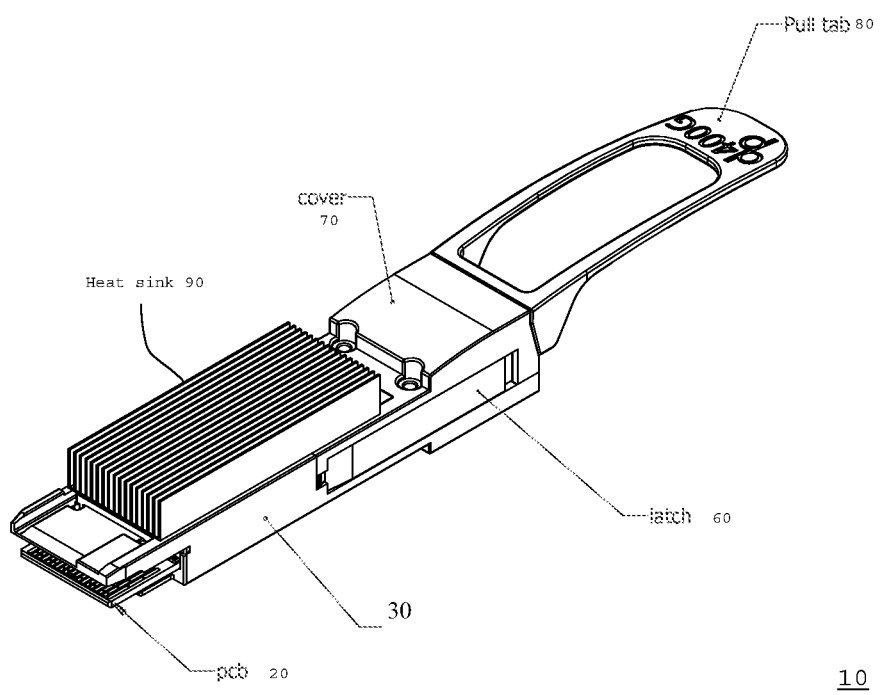
FIG. 1 is a perspective view of an example of an opto-mechanical device.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There is provided a method and device for heat dissipation that enable heat generated by active elements such as laser driver (transceiver chips) that contact an upper side of the printed circuit board (PCB) to be dissipated (a) through the PCB—to a lower side of the PCB, (b) through a heat conductive material that is positioned in gap between the lower side of the PCB and a lower portion of a housing, (c) through one or more continuous paths formed in the housing—from the lower portion of the housing to an upper portion of the housing, and (b) through a heat sink that is thermally coupled to the housing.

The one or more continuous paths may spread along the entire housing, along a substantial part of the housing or along a non-substantial part of the housing. The housing is made of a thermally conductive material that includes thermally conductive parts that define the paths.

To allow an efficient thermal flow through the device, there may not be voids in the heat dissipation path—especially when passing through the housing and in the interface between the PCB and housing.

The heat sink may be thermally coupled to the housing without forming voids within its interface area.

The heat sink is located above the active elements and is cooler than the housing thus causing heat to flow specifically to the heat sink and to be removed by convection.

Efficient thermal flow occurs if the housing is both thermally conducting and continuous in structure.

During the flow through the housing, heat may also be dissipating in any part of the housing—for example when passing through sidewalls of the housing heat may flow to the environment via radiation and convection.

The device housing is fabricated from one piece of thermally conducting material and thus allows for continuous thermal flow. This may be in contrast to the standard approach for transceiver housing design made from two separate parts with a thermal boundary layer between them. In either case, the PCB is placed inside the housing; however, in the conventional approach,—the lower portion of the housing—is connected by fasteners to the upper portion of the housing. In this invention, the fasteners are thus not needed.

Heat may dissipate from one side of the PCB to the other through thermally conductive elements (such as vias) that pass through the PCB bulk. The PCB is designed to incorporate these elements in order to ensure efficient heat flow from active transceiver components generating heat on the upper PCB side to the lower PCB side.

The housing may include one or more holes that are used for injecting the thermally conductive material to the gap between the housing and the PCB. In order to ensure a void-less layer of the thermally conducting material, both hole diameter and location need to be designed specifically as well as the material viscosity, flow velocity, application pressure and temperature. Application of the thermally conducting material to the device via the holes may be carried out using injection, for example. After the injection of the thermally conductive material the one or more holes may be closed—in order to confine the thermally conductive material in the gap. Some of the thermally conductive material may remain in the one or more holes.

Figure 2:
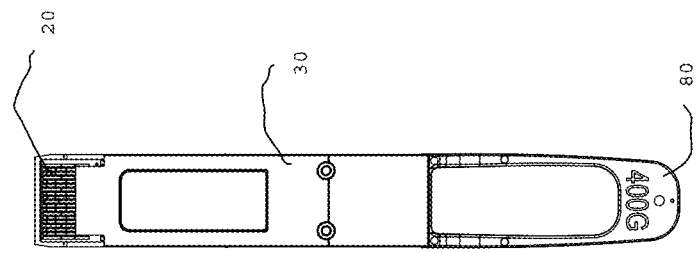
FIG. 2 is a bottom view of an example of an opto-mechanical device.
Figure 3:
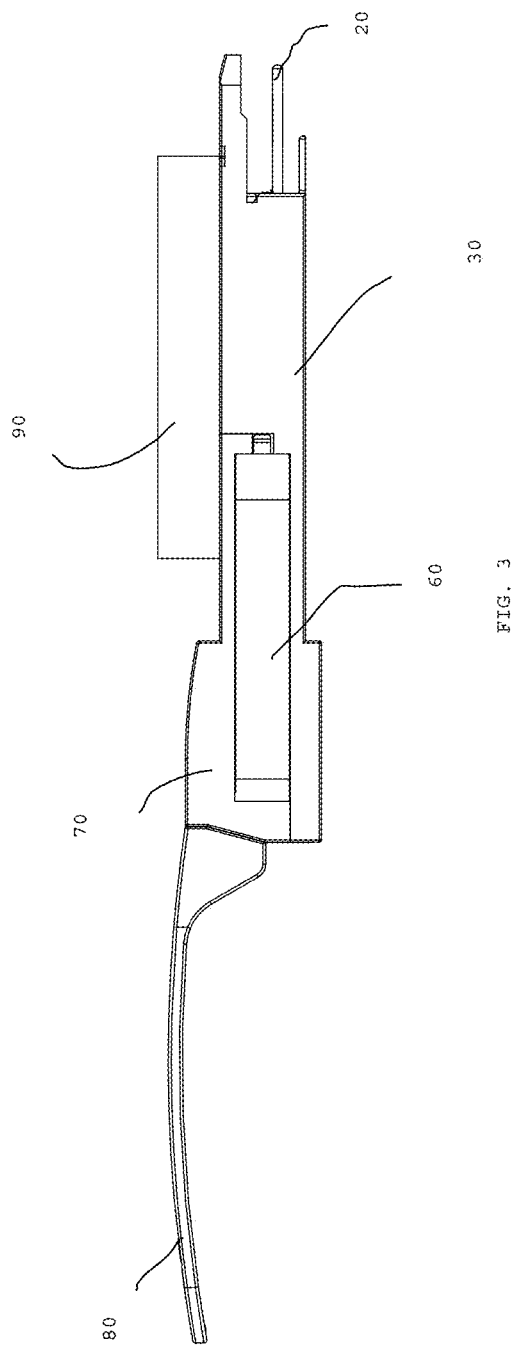
FIG. 3 is a side view of an example of an opto-mechanical device.

FIG. 1 is a perspective view of an example of an opto-mechanical device 10. FIG. 2 is a bottom view of an example of an opto-mechanical device 10. FIG. 3 is a side view of an example of an opto-mechanical device 10.

The opto-mechanical device 10 includes a printed circuit board (PCB) 20, a housing 30, latch 60, cover 70, pull tab 80 and heat sink 90.

An optical cable may be connected to the opto-mechanical device 10. The latch 60 locks the optical cable to the opto-mechanical device 10. The pull tab 80 can be pulled away from the housing 30 thereby releasing the latch 60 and allowing the optical cable to be disconnected. The housing 30 maintains the latch 60 and the housing together.

Heat sink 90 is thermally coupled (preferably without a thermal gap) to the housing 30. The housing 30 surrounds the PCB 20. The PCB 20 can slide into an opening formed by the housing 30. The housing is a one-part housing. It may be virtually segmented to a lower portion and an upper part. The housing 30 formed multiple continuous heat paths between the lower portion and the upper part.

The PCB is thermally coupled to the lower portion of the housing via the thermally conductive material.

Figure 4:
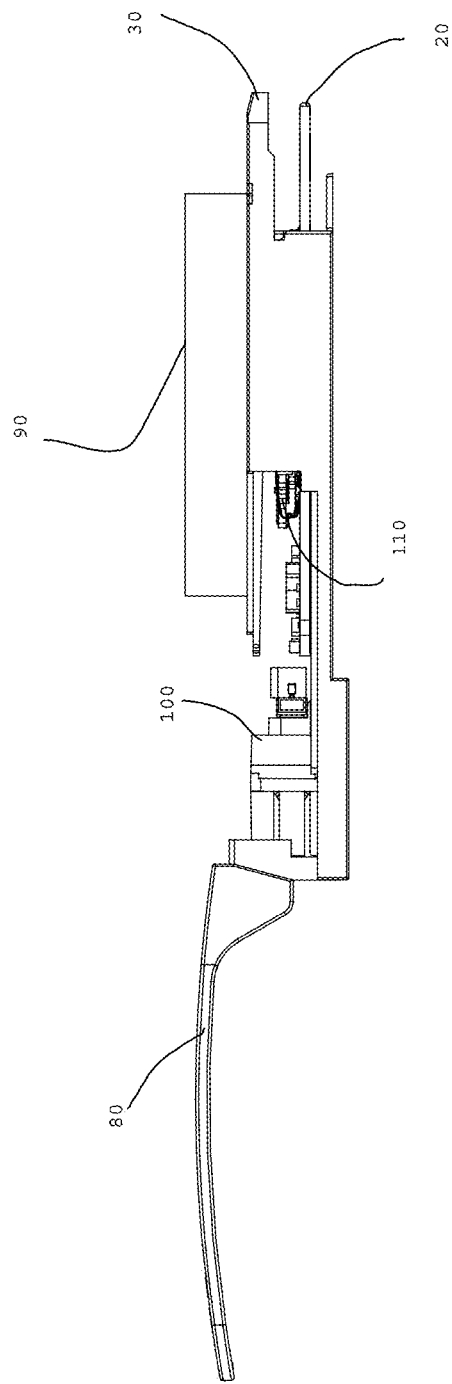
FIG. 4 is a side view of an example of an opto-mechanical device in which the cover is not shown.

FIG. 4 is a side view of an example of an opto-mechanical device 10 in which the cover is not shown. FIG. 4 illustrates a cable interface 100 that may interface with the optic cable and also illustrates the active components 110 of the transceiver connected to the upper side of PCB 20.

Figure 5:
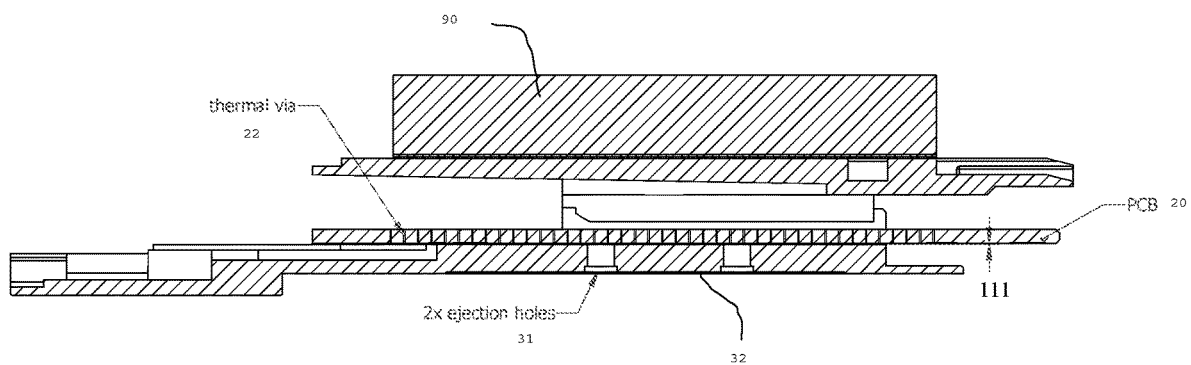
FIG. 5 is a cross sectional view of an example of an opto-mechanical device in which the cover is not shown.

FIG. 5 is a cross sectional view of an example of an opto-mechanical device 10 in which the cover is not shown. FIG. 5 illustrates one or more thermal conductors such as thermal vias that thermally couple an area of the upper side of the PCB 20 to at an area of the lower side. The area of the upper side is where the optical transceiver active elements are located (denoted 110 in FIG. 4). The upper side and the lower side of the PCB may be thermally coupled in other manners—for example by one or more thermally conducting and electrically isolated conductors printed on the PCB.

FIG. 5 also shows one or more holes (such as injection holes 31) that are formed in the lower portion of housing 30—these one or more holes are used to inject thermal material in the thermal material gap 11 between the lower portion of PCB 20 and the lower portion of the housing. In FIG. 5 the lower portion is denoted 32. The injection occurs after the PCB 20 is at least partially inserted into the housing 30.

Figure 6:
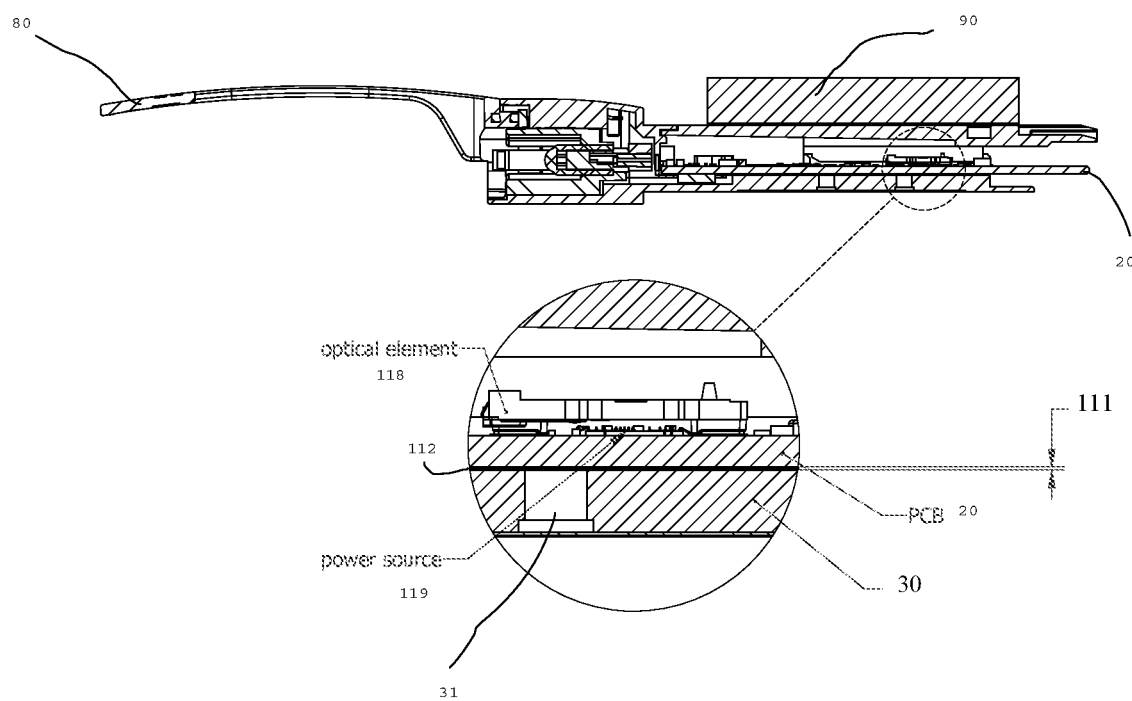
FIG. 6 is a cross sectional view of an example of an opto-mechanical device in which the cover is not shown.

FIG. 6 is a cross sectional view of an example of an opto-mechanical device 10 in which the cover is not shown.

FIG. 6 illustrates thermally conductive material 112 (such as a thermally conductive grease, gel, adhesive, pad)—that fills a thermal material gap between PCB 20 and housing 30. The thermally conductive material may fill (or partially fill) the entire gap—as long as it formed one or more gapless thermal paths for heat dissipation between PCB 20 and housing 30. The thermally conductive material gap may be about 100 microns—or any other value—for example it may be below 1 millimeter.

FIG. 6 also illustrated an optical element 118 (that may be an active element) and a power source 119 of the optical transceiver.

Figure 7:
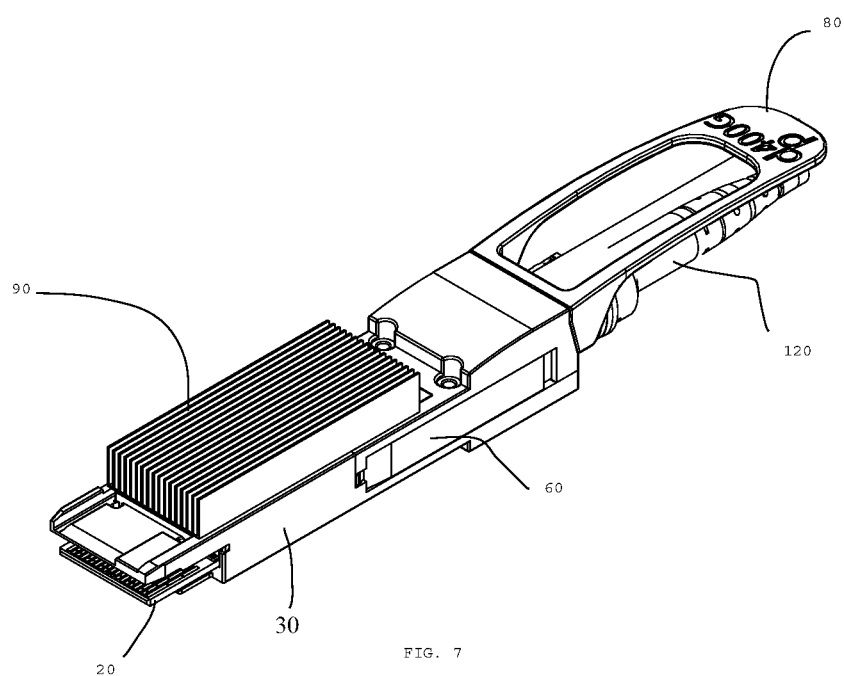
FIG. 7 is a perspective view of an example of an opto-mechanical device that is coupled to an optical cable.
Figure 8:
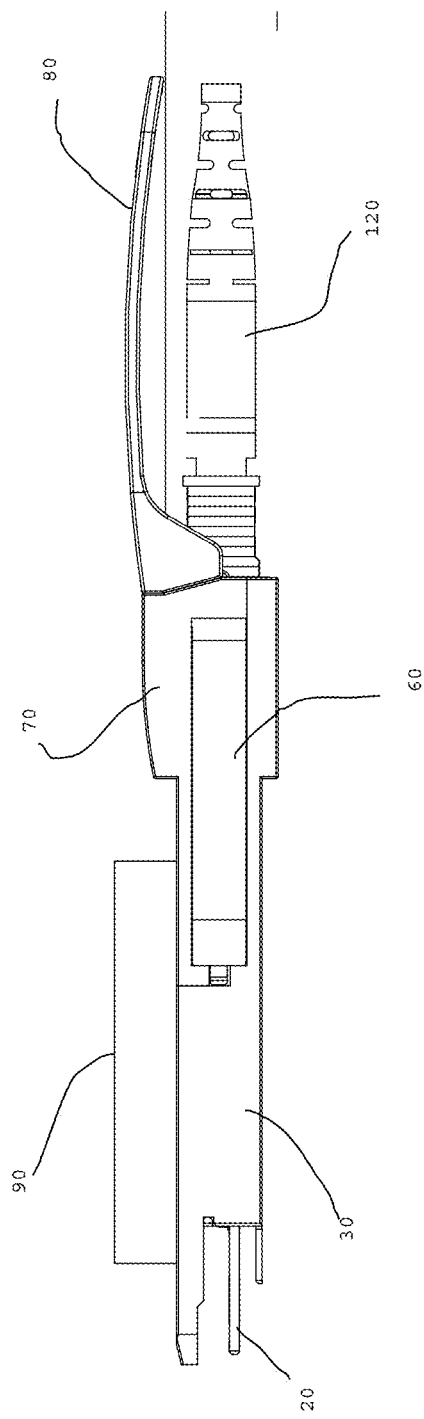
FIG. 8 is a side view of an example of an opto-mechanical device that is coupled to an optical cable.

FIG. 7 is a perspective view of an example of an opto-mechanical device 10 that is coupled to an optical cable 120. FIG. 8 is a side view of an example of an opto-mechanical device 10 that is coupled to an optical cable 120.

Figure 9:
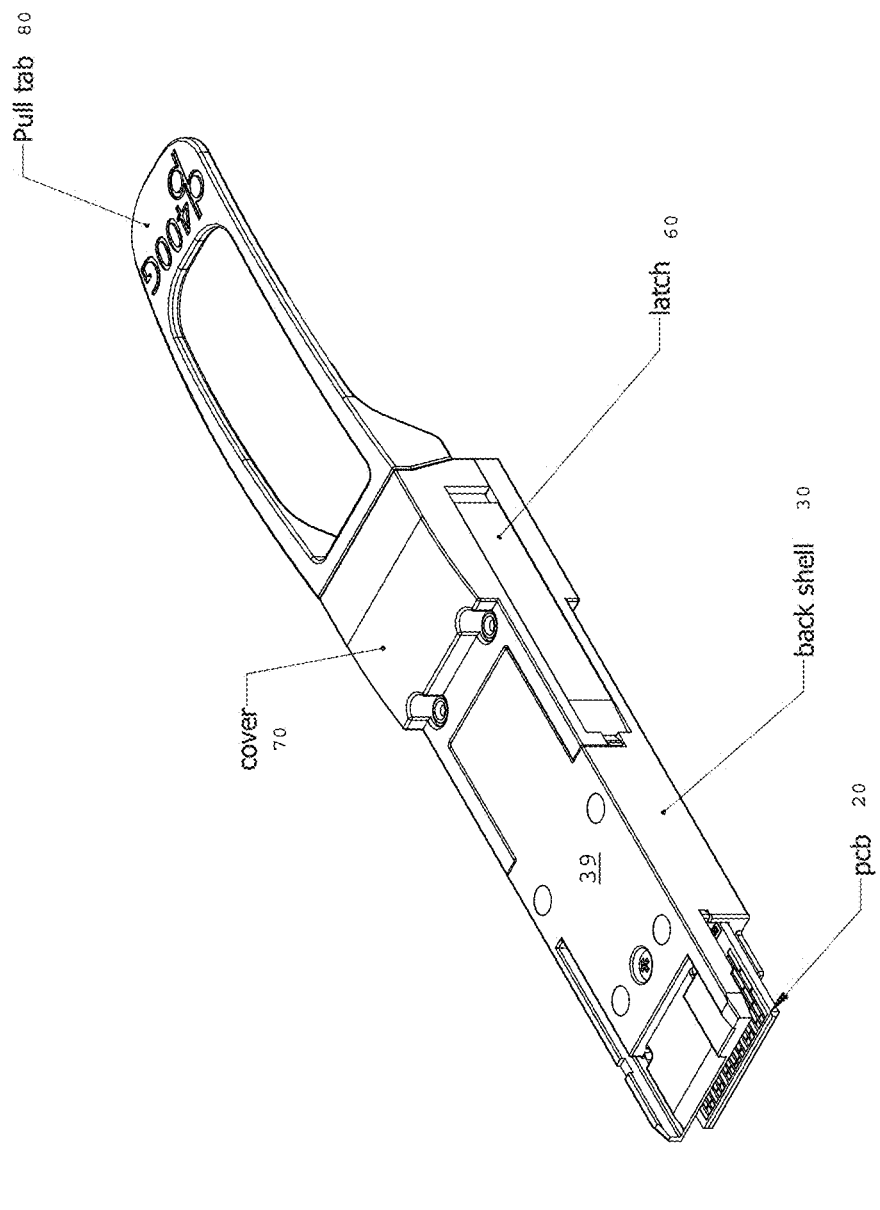
FIG. 9 is a perspective view of an example of an opto-mechanical device in which the heat sink is not shown.

FIG. 9 is a perspective view of an example of an opto-mechanical device 10 in which the heat sink is not shown.

Figure 10:
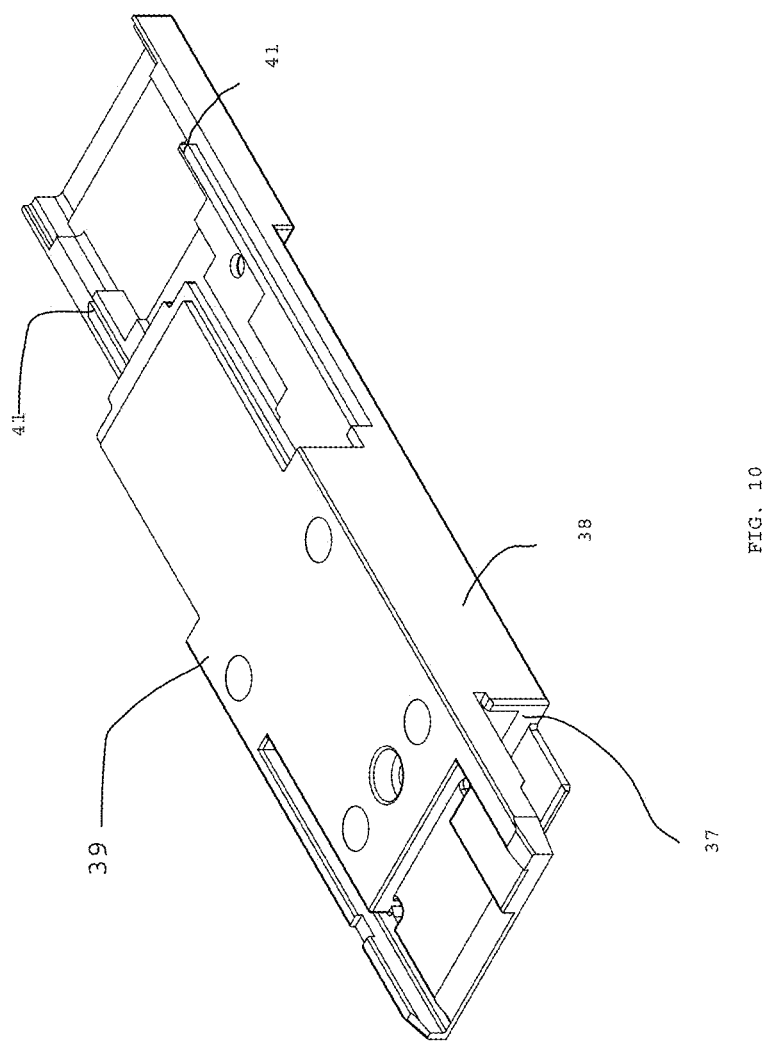
FIG. 10 is a perspective view of an example of housing.
Figure 11:
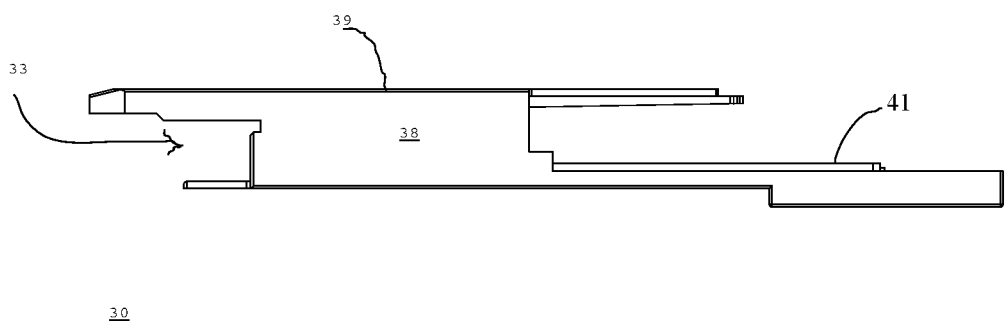
FIG. 11 is a side view of an example of housing.
Figure 12:
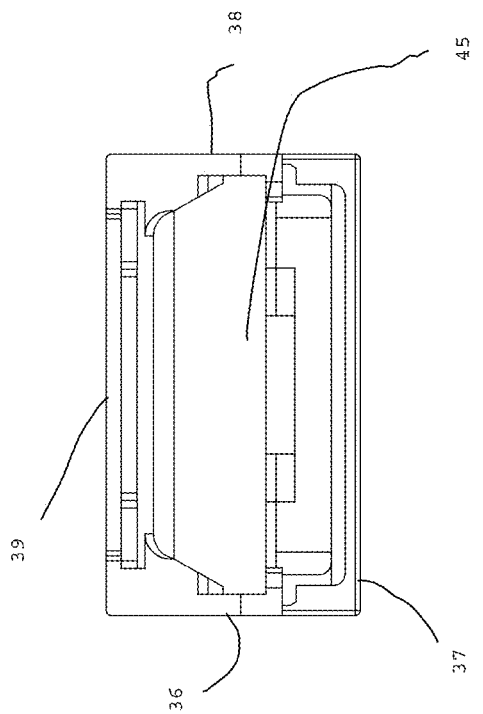
FIG. 12 is a front view of an example of housing.

FIG. 10 is a perspective view of an example of housing 30. FIG. 11 is a side view of an example of housing 30. FIG. 12 is a front view of an example of housing 30.

The housing 30 includes upper portion 39, right sidewall 38, lower portion 37 and left sidewall 36. The lower portion 37 is longer than the upper portion 39. Upper portion 39, the front region of lower portion 37, the right sidewall 38 and the left sidewall 36 form a cage.

Part of the PCB 20 is included in the cage.

The lower portion 37 includes rails 41 that contact the narrow sides of the PCB 20 when the PCB 20 is inserted into the cage.

PCB 20 may be connected or fastened to housing 30. The rear portion of the lower portion 37 may support a cable interface. The front portion of housing forms an opening 33 in which the PCB 20 and the thermally conductive material may be positioned.

The housing may have other shapes and sizes.

The housing can be made of one or more thermally conductive materials—that may differ from thermally conductive material 112.

The housing can be elastic or rigid.

For example—the housing can be made of (or may include) Aluminum, Zamak, Copper and the like.

Non-limiting examples of parameters of thermally conductive material 112 are:
a. Thermal conductivity (w/m–k)~1-50
b. Viscosity (mPa·S)~100,000-300000
c. Temperature stability (° C.)~-50-200
d. Outgasing (%), 200° C.@96 hrs~0.005-0.05

There may be provided a method for cooling an active component of an optical transceiver, the method may include dissipating heat generated by an active component of an optical transceiver, wherein the active component is connected to an area of an upper side of a printed circuit board, wherein the heat is dissipated through (a) one or more thermal conductors that thermally coupled the area of the upper side to an area of a lower side of the printed circuit board; (b) at least one gapless thermally conductive path that is formed by a thermally conductive material, between the area of the lower side and between a lower portion of a housing; (c) one or more continuous thermal paths that are formed between the lower portion of the housing and an upper portion of the housing; and (d) a heat sink that is thermally coupled to the upper portion of the housing; and wherein the housing surrounds the printed circuit board.

An active component of the optical transceiver may be a transistor, an amplifier, a light source, a receiver, or any other component that consumes energy and belongs to the optical transceiver.

The terms "including", "comprising", "having", "consisting" and "consisting essentially of" are used in an interchangeable manner. For example—any module or chip may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:
1. A device, comprising:
a transceiver that comprises an active component, a printed circuit board that comprises an upper side, a lower side, and thermal conductors that pass through the printed circuit board and thermally couple an area of the upper side to at an area of the lower side;
wherein the active component is connected to the area of the upper side;
a housing that comprises an upper portion and a lower portion that form one or more continuous heat dissipation paths; wherein the housing surrounds the printed circuit board;
a thermally conductive material that is positioned between the housing and the printed circuit board and forms at least one void-less thermally conductive path between the housing and the printed circuit board; wherein the active component is positioned within an empty space; and
a heat sink that is thermally coupled to the upper portion of the housing.

2. The device according to claim 1 wherein the housing comprises at least one hole for receiving the thermally conductive material.

3. The device according to claim 2 comprising at least one seal for sealing the at least one hole.

4. The device according to claim 1 wherein the housing comprises sidewalls for dissipating the heat that passes through the one or more continuous heat dissipation paths.

5. The device according to claim 1, wherein the thermally conductive material fully fills a part of the gap that is positioned between the area of the lower side of the printed circuit board and a corresponding area of the housing.

6. The device according to claim 1 wherein the upper and lower portions of the housing belong to a single part of the housing that defines the one or more continuous heat dissipation paths.

7. A method for cooling an active component of an optical transceiver, the method comprises:
dissipating heat generated by an active component of an optical transceiver, wherein the active component is connected to an area of an upper side of a printed circuit board, wherein the heat is dissipated through (a) one or more thermal conductors that pass through the printed circuit board and thermally couple the area of the upper side to an area of a lower side of the printed circuit board; (b) at least one gapless thermally conductive path that is formed by a thermally conductive material, between the area of the lower side and between a lower portion of a housing; (c) one or more continuous thermal paths that are formed between the lower portion of the housing and an upper portion of the housing; and (d) a heat sink that is thermally coupled to the upper portion of the housing; wherein the active component is positioned within an empty space; and
wherein the housing surrounds the printed circuit board.

8. The method according to claim 7, wherein the housing comprises at least one hole for receiving the thermally conductive material.

9. The device according to claim 8, comprising at least one seal for sealing the at least one hole.

10. The method according to claim 7, wherein the housing comprises sidewalls for dissipating the heat that passes through the one or more continuous heat dissipation paths.

11. The method according to claim 7, wherein the thermally conductive material fully fills a part of the gap that is positioned between the area of the lower side of the printed circuit board and a corresponding area of the housing.

12. The method according to claim 7, wherein the upper and lower portions of the housing belong to a single part of the housing that defines the one or more continuous heat dissipation paths.

13. The method according to claim 7 wherein the thermally conductive material at least partially fills a thermally conductive material gap formed between the housing and the printed circuit board.

14. The method according to claim 13, wherein a height of the thermally conductive material gap is 100 microns.

15. The method according to claim 13, wherein the printed circuit board is thicker than the thermally conductive material gap.

16. The method according to claim 7 wherein the optical transceiver comprises a latch and a pull tab, wherein the pull tab is configured to move to a first position thereby releasing the latch and releasing an optical cable connected to the device.

17. The device according to claim 1 wherein the thermally conductive material at least partially fills a thermally conductive material gap formed between the housing and the printed circuit board.

18. The device according to claim 17, wherein a height of the thermally conductive material gap is 100 microns.

19. The device according to claim 17, wherein the printed circuit board is thicker than the thermally conductive material gap.

20. The device according to claim 1 comprising a lath and a pull tab, wherein the pull tab is configured to move to a first position thereby releasing the latch and releasing an optical cable connected to the device.

* * * * *